(12) United States Patent
Arai et al.

(10) Patent No.: US 10,892,217 B2
(45) Date of Patent: Jan. 12, 2021

(54) WIRING SUBSTRATE AND SEMICONDUCTOR DEVICE

(71) Applicant: SHINKO ELECTRIC INDUSTRIES CO., LTD., Nagano (JP)

(72) Inventors: Takashi Arai, Nagano (JP); Fumimasa Katagiri, Nagano (JP); Katsuya Fukase, Nagano (JP)

(73) Assignee: SHINKO ELECTRIC INDUSTRIES CO., LTD.

( * ) Notice: Subject to any disclaimer, the term of this patent is extended or adjusted under 35 U.S.C. 154(b) by 0 days.

(21) Appl. No.: 16/523,573

(22) Filed: Jul. 26, 2019

(65) Prior Publication Data

US 2020/0043841 A1 Feb. 6, 2020

(30) Foreign Application Priority Data

Jul. 31, 2018 (JP) ................. 2018-143361

(51) Int. Cl.
*H01L 23/528* (2006.01)
*H01L 23/498* (2006.01)
*H01L 21/48* (2006.01)

(52) U.S. Cl.
CPC ...... *H01L 23/49838* (2013.01); *H01L 21/481* (2013.01); *H01L 21/4846* (2013.01)

(58) Field of Classification Search
CPC .................................................. H01L 21/4814
See application file for complete search history.

(56) References Cited

U.S. PATENT DOCUMENTS

| | | | | |
|---|---|---|---|---|
| 2010/0136781 A1* | 6/2010 | Kulkarni | ............... | H01L 23/528 438/622 |
| 2013/0241071 A1* | 9/2013 | Hsieh | .................... | H01L 24/11 257/773 |

FOREIGN PATENT DOCUMENTS

JP          2012054519 A          3/2012

* cited by examiner

*Primary Examiner* — Cheung Lee
(74) *Attorney, Agent, or Firm* — Tarolli, Sundheim, Covell & Tummino LLP

(57) ABSTRACT

A wiring substrate includes first wiring portions, an insulation layer covering the first wiring portions, openings extending through the insulation layer in a thickness-wise direction, partially exposing upper surfaces of the first wiring portions, and differing from each other in capacity, and second wiring portions, each of which includes a via wiring filling one of the openings and a columnar connection terminal electrically connected to the via wiring and arranged on an upper surface of the insulation layer. The via wiring includes an electrolytic plated layer and an electroless plating structure including N layers (N is integer and ≥0) arranged between the electrolytic plated layer and the upper surface of the first wiring portion exposed in a bottom of the opening. The via wiring is formed so that the electroless plating structure has a thickness that increases as a capacity of the opening filled with the via wiring is increased.

7 Claims, 9 Drawing Sheets

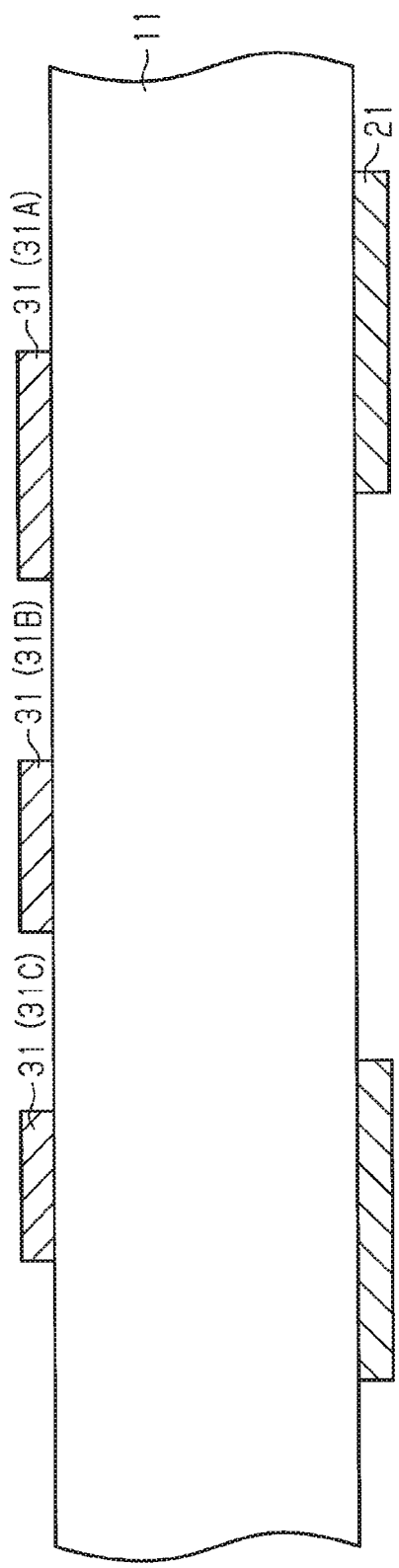
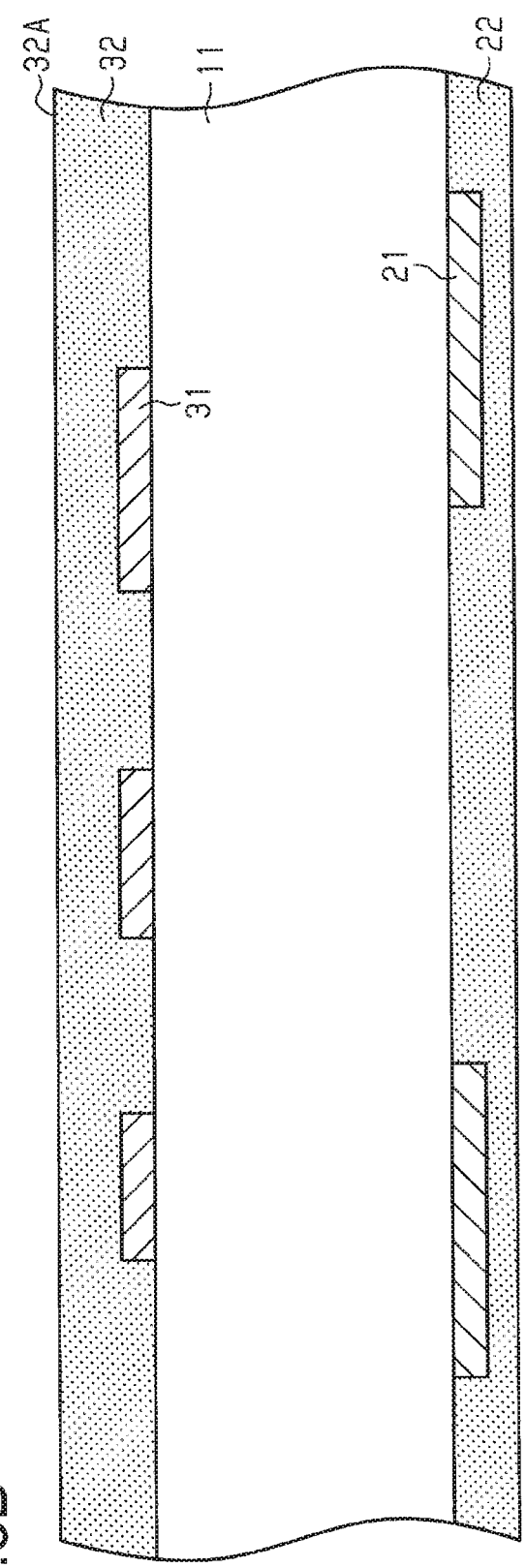
Fig.3A
Fig.3B

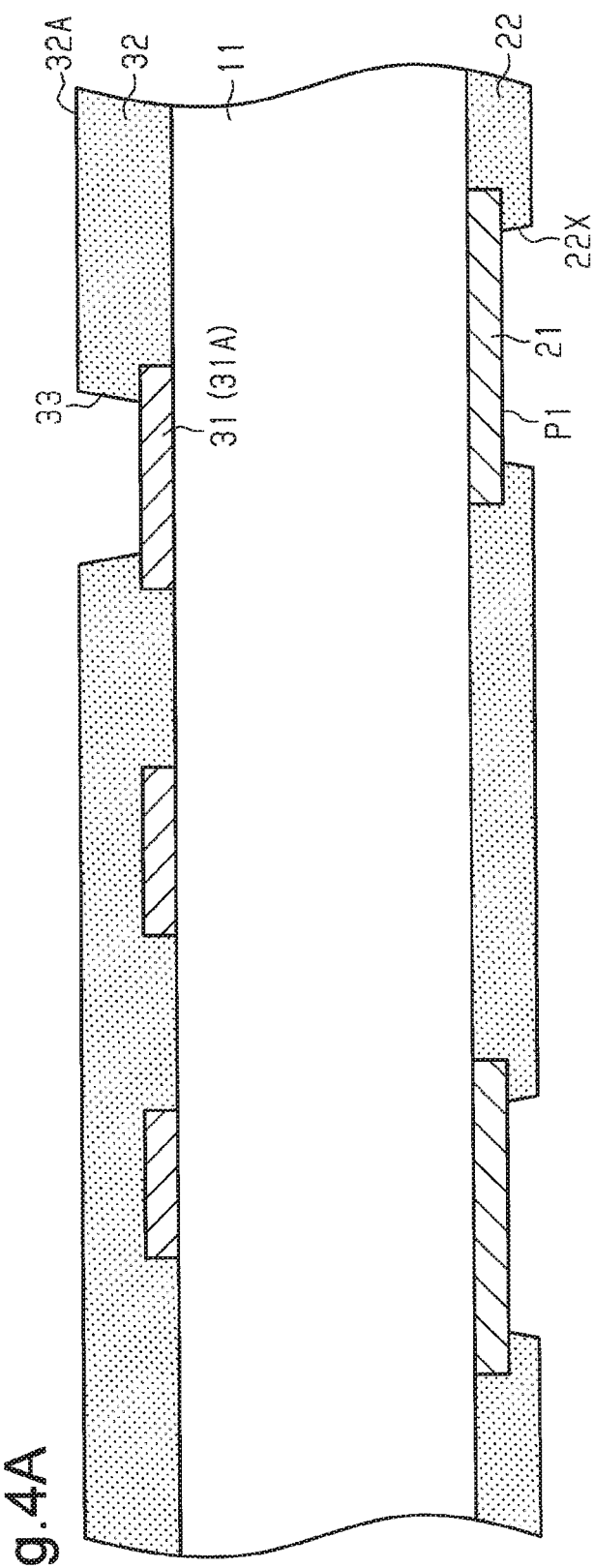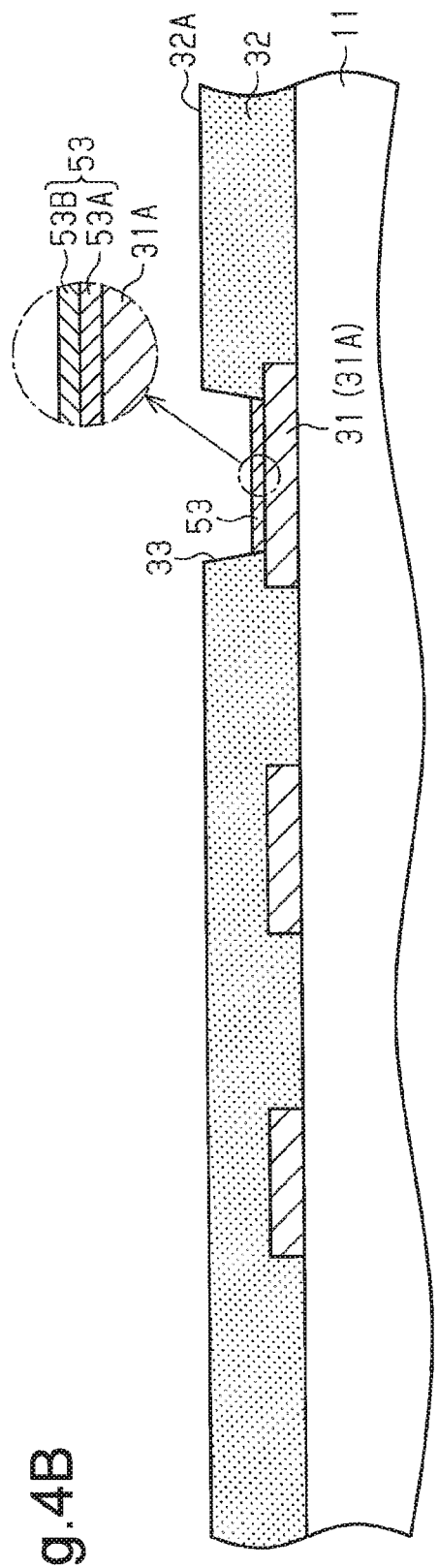

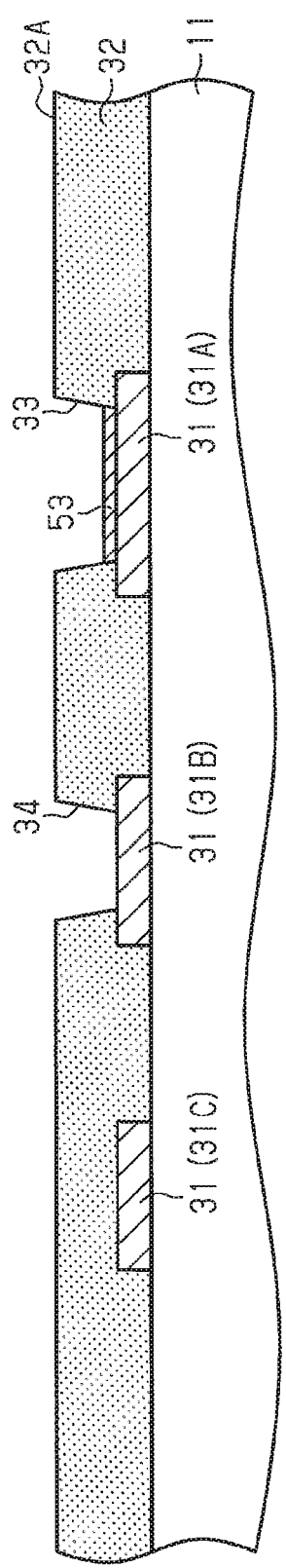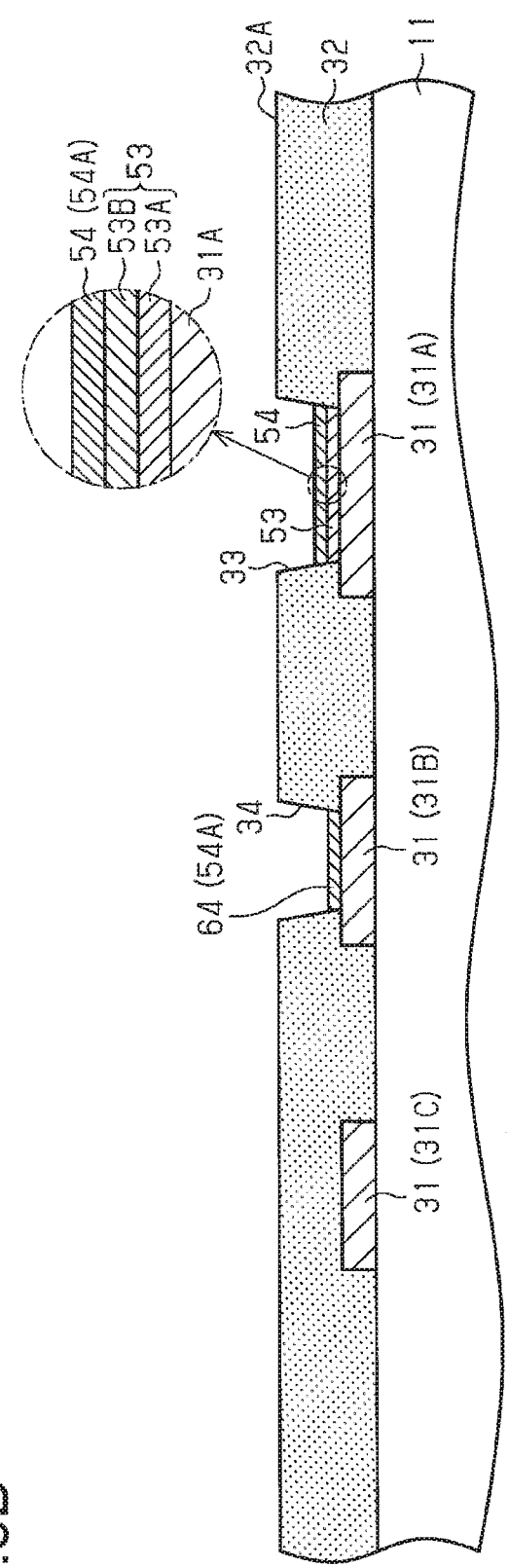

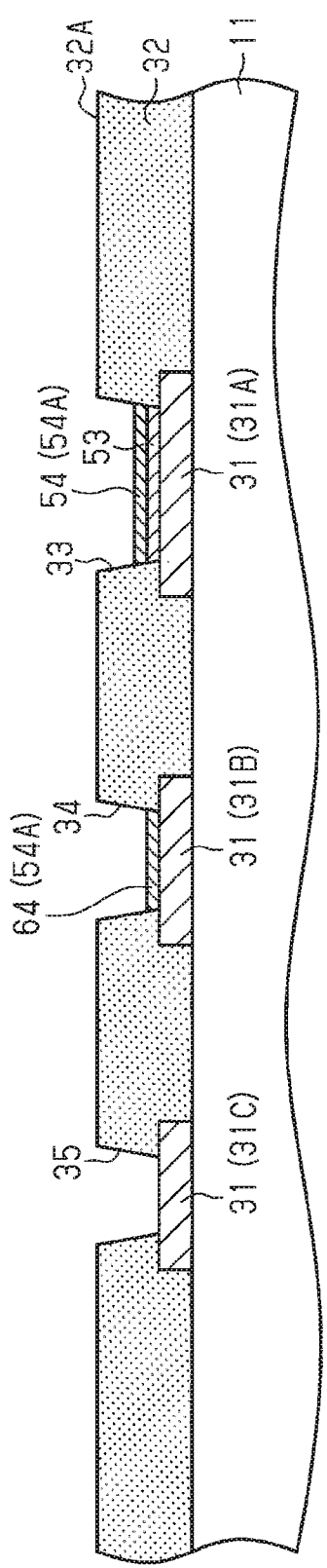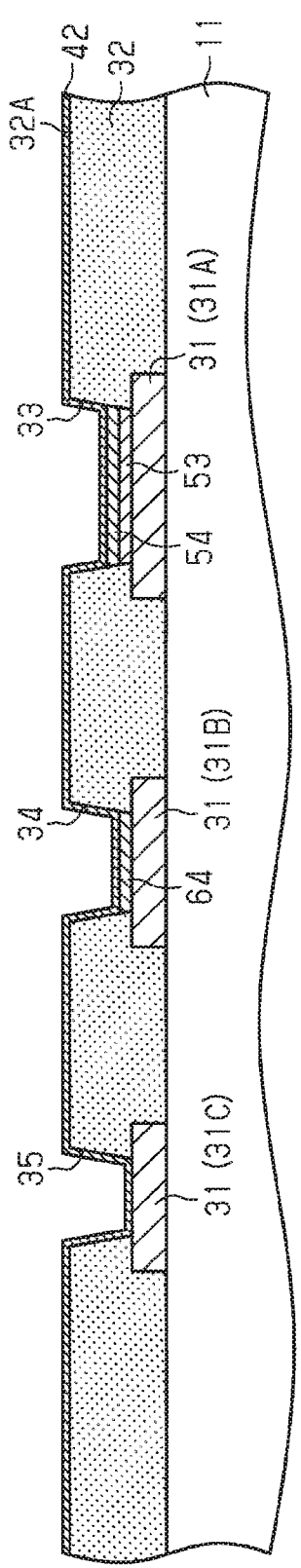

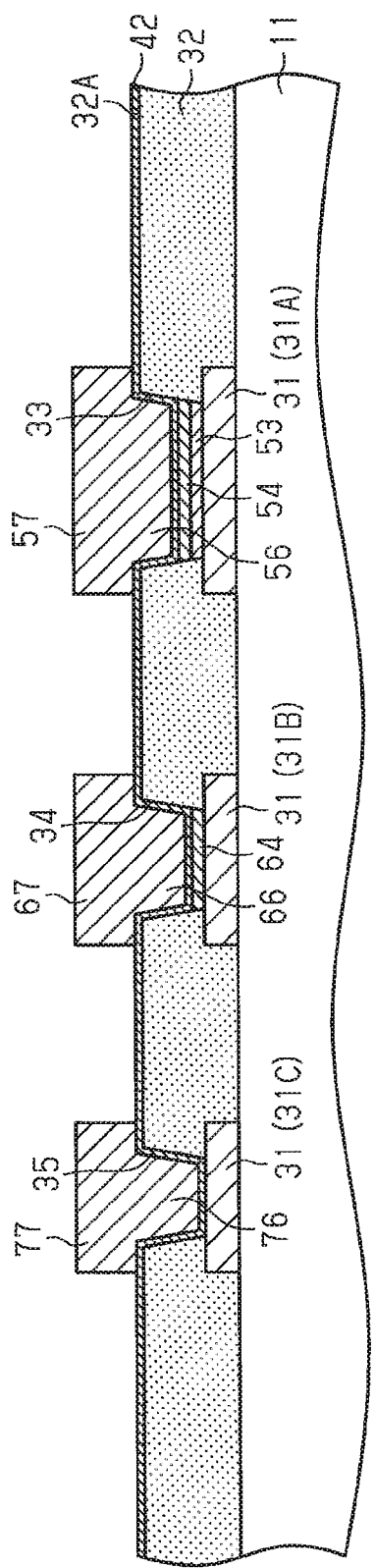
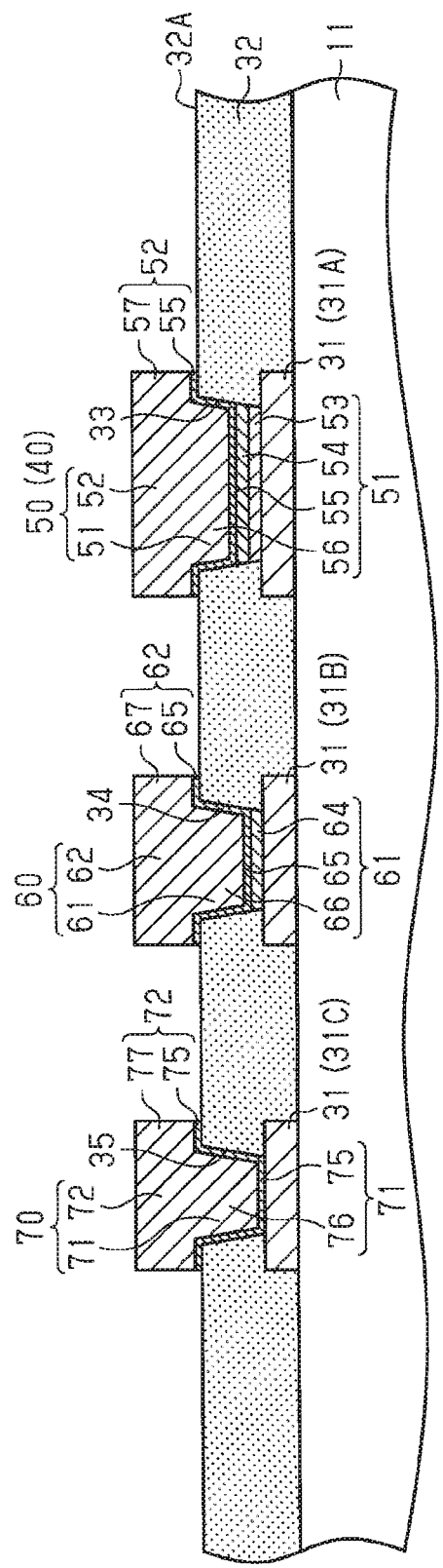

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2018-143361, filed on Jul. 31, 2018, the entire contents of which are incorporated herein by reference.

FIELD

This disclosure relates to a wiring substrate, a semiconductor device, and a method for manufacturing a wiring substrate.

BACKGROUND

Wiring substrates on which electronic components such as semiconductor elements are mounted have various shapes and structures. As recent semiconductor elements are highly integrated and highly sophisticated, there is an increasing demand that wiring substrates on which semiconductor elements are mounted have finer wiring. Japanese Laid-Open Patent Publication No. 2012-54519 describes a wiring substrate in a related art. In the wiring substrate, a wiring pattern and an insulation layer covering the wiring pattern are formed on a base substrate. A via hole extends through the insulation layer in the thickness-wise direction, and a metal post (columnar connection terminal) is formed on the wiring pattern exposed in the via hole.

When a wiring substrate includes various types of via holes having different capacities and the via holes are filled with via wirings, metal posts formed on the via wirings may have different heights. Such differences in height between metal posts may decrease the reliability of connection with a semiconductor element. For example, a lower metal post may be spaced apart from an electrode of the semiconductor element by a greater gap than other metal posts. This may cause connection failure due to lack of connecting solder. Also, on a higher metal post, surplus connecting solder may spread between metal posts, so adjacent metal posts may short via the solder.

SUMMARY

An embodiment of a wiring substrate includes a plurality of first wiring portions, an insulation layer that covers the first wiring portions, a plurality of openings, each of the openings extending through the insulation layer in a thickness-wise direction to partially expose an upper surface of one of the first wiring portions, and a plurality of second wiring portions. The openings differ from each other in capacity. Each of the second wiring portions includes a via wiring and a columnar connection terminal. Each of the openings is filled with the via wiring of one of the second wiring portions. The columnar connection terminal is arranged on an upper surface of the insulation layer and electrically connected to the via wiring of a corresponding one of the second wiring portions. The via wiring includes an electrolytic plated layer and an electroless plating structure including N layers where N represents an integer greater than or equal to zero. The electroless plating structure is arranged between the electrolytic plated layer and the upper surface of a corresponding one of the first wiring portions exposed in a bottom of a corresponding one of the openings.

The via wiring is formed so that the electroless plating structure has a thickness that increases as a capacity of the corresponding opening filled with the via wiring is increased.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 3A, 3B, 4A, 4B, 5A, 5B, 6A, 6B, 7A, 7B, 8A, and 8B are schematic cross-sectional views illustrating a method for manufacturing the wiring substrate illustrated in FIG. 1.

DESCRIPTION OF THE EMBODIMENTS

Figure 1:
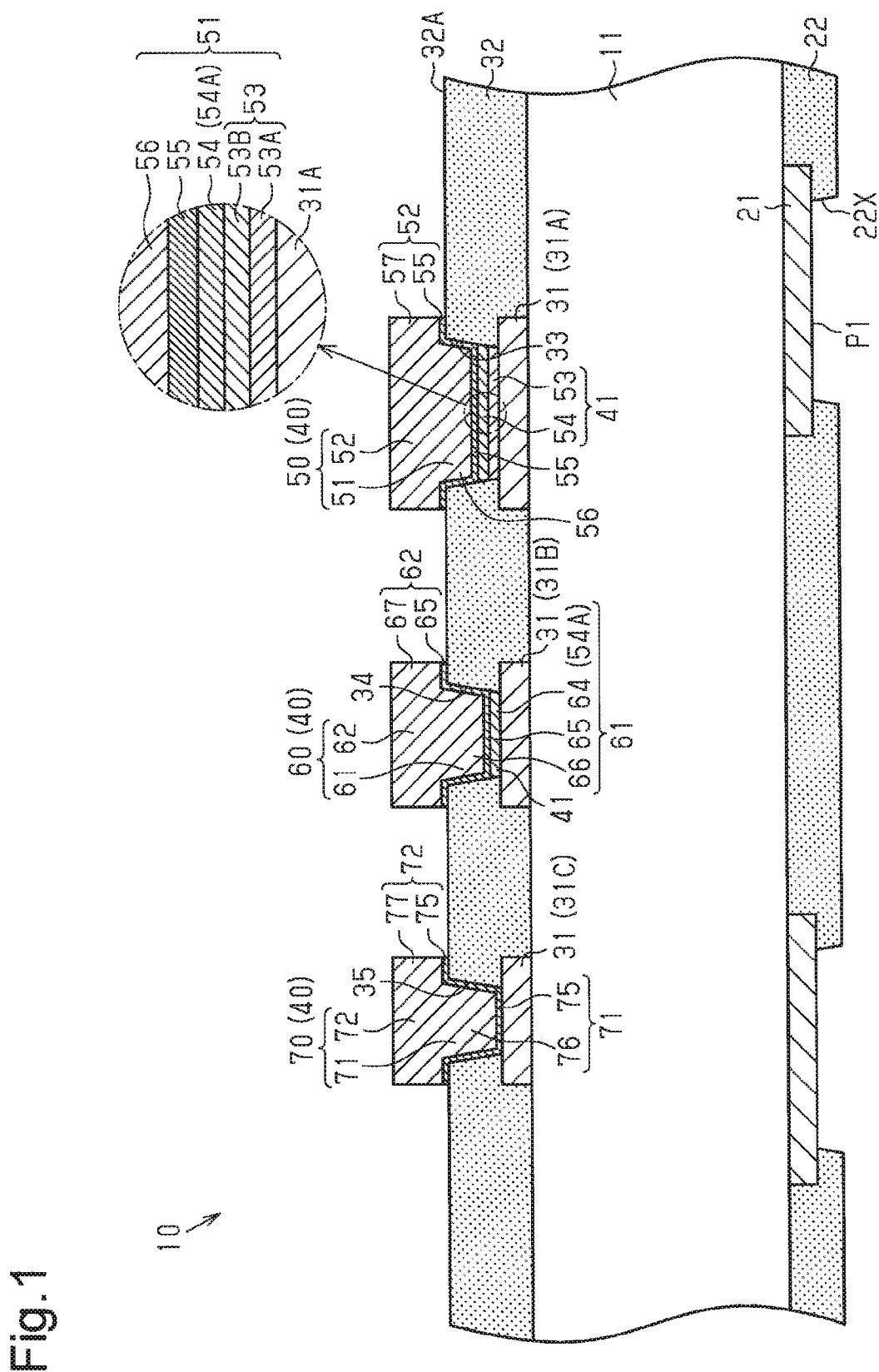
FIG. 1 is a schematic cross-sectional view illustrating an embodiment of a wiring substrate.

Embodiments will now be described with reference to the drawings. The drawings may not be to scale, and the relative size, proportions, and depiction of elements in the drawings may be exaggerated for clarity, illustration, and convenience. Moreover, to facilitate understanding, hatching lines may not be illustrated or be replaced by shadings in the cross-sectional drawings. In the present specification, "plan view" refers to a view of a subject taken in a vertical direction (for example, upper-lower direction in FIG. 1), and "planar shape" refers to a shape of a subject taken in the vertical direction.

As illustrated in FIG. 1, a wiring substrate 10 includes a substrate body 11. The substrate body 11 has a lower surface, on which a wiring layer 21 and a solder resist layer 22 are sequentially formed. The substrate body 11 has an upper surface, on which a wiring layer 31 including multiple (for example, three in FIG. 1) wiring portions 31A, 31B, and 31C, a solder resist layer 32, and a wiring layer 40 are sequentially formed.

For example, a core substrate, a build-up core substrate, which includes a core substrate, or a coreless substrate, which does not include a core substrate, may be used as the substrate body 11. When a coreless substrate is used as the substrate body 11, for example, the side and upper surfaces of the lowermost wiring layer (for example, wiring layer 21 in FIG. 1) may be embedded in the lowermost insulation layer of the substrate body 11, and the lower surface of the lowermost wiring layer may be exposed from the lowermost insulation layer.

The material of the wiring layers 21 and 31 may be, for example, copper (Cu) or a copper alloy. The material of the solder resist layers 22 and 32 may be, for example, a photosensitive insulative resin including a phenol resin or a polyimide resin as a main component. The solder resist layers 22 and 32 may include, for example, a filler such as silica or alumina.

The wiring layer 31 is formed on the upper surface of the substrate body 11. The wiring layer 31 is, for example, electrically connected to the wiring layer 21 via an inner wiring layer or a through electrode of the substrate body 11.

The solder resist layer 32 is formed on the upper surface of the substrate body 11 and covers the wiring portions 31A to 31C. The solder resist layer 32 is the outermost insulation layer (here, uppermost insulation layer) of the wiring substrate 10. The thickness of the solder resist layer 32 from the upper surface of the wiring layer 31 to an upper surface 32A of the solder resist layer 32 may be, for example, approximately 15 to 25 μm.

Openings 33, 34, and 35 extend through the solder resist layer 32 in the thickness-wise direction of the solder resist layer 32 and partially expose the upper surface of the wiring layer 31. In the present example, the opening 33 partially exposes the upper surface of the wiring portion 31A, the opening 34 partially exposes the upper surface of the wiring portion 31B, and the opening 35 partially exposes the upper surface of the wiring portion 31C. The openings 33, 34, and 35 differ from each other in capacity (i.e. volume of the opening). In the present example, the opening 33 has a larger capacity than the openings 34 and 35, and the opening 34 has a larger capacity than the opening 35.

The openings 33, 34, and 35 are each tapered so that the open width (open diameter) is decreased from the upper side (upper surface 32A of solder resist layer 32) toward the lower side (upper surface of wiring layer 31). Each of the openings 33, 34, and 35 has a wall surface that is downwardly inclined from the upper surface 32A of the solder resist layer 32 toward the center of the openings 33, 34, and 35 in the width-wise direction (radial direction). For example, the wall surfaces of the openings 33, 34, and 35 linearly extend without steps in a cross-sectional view. Thus, the open diameter of each of the openings 33, 34, and 35 is continuously decreased from the upper side toward the lower side. For example, the openings 33, 34, and 35 each have the form of an inverted truncated cone so that the top has a larger open diameter than the bottom.

The openings 33, 34, and 35 may have any planar shape and size. The openings 33, 34, and 35 may have, for example, an identical planar shape. In the present example, the planar shape of each of the openings 33, 34, and 35 is circular. The openings 33, 34, and 35 have, for example, the same depth. The depth of the openings 33, 34, and 35 may be, for example, approximately 15 to 25 μm.

The opening 33 has a larger open width (open diameter) than each of the openings 34 and 35. The opening 34 has a larger open width (open diameter) than the opening 35. For example, the top open diameter of the opening 33 is set to be greater than the top open diameter of each of the openings 34 and 35. The top open diameter of the opening 34 is set to be greater than the top open diameter of the opening 35. For example, the top open diameter of the opening 33 is approximately 60 to 150 μm. The top open diameter of the opening 34 is approximately 30 to 60 μm. The top open diameter of the opening 35 is approximately 10 to 30 μm.

The opening 33, which has the largest capacity among the openings 33, 34, and 35, is formed, for example, through photolithography. The openings 34 and 35 are formed, for example, through laser drilling.

The wall surfaces of the openings 33, 34, and 35 may have the same inclination angle or may have different inclination angles. For example, the inclination angle of the wall surface of the opening 33, which has the largest capacity, is set to differ from the inclination angle of the wall surfaces of the remaining openings 34 and 35. For example, the inclination angle of the wall surface of the opening 33, which is formed through photolithography, is greater than the inclination angle of the wall surfaces of the openings 34 and 35, which are formed through laser drilling. For example, the inclination angle of the wall surface of the opening 33 formed through photolithography is proximate to ninety degrees (orthogonal). In this specification, the inclination angle of the wall surface of each of the openings 33, 34, and 35 refers to an acute angle formed by the upper surface of the wiring layer 31 and the wall surface of the openings 33, 34, and 35.

The wiring layer 40 is formed on the upper surface 32A of the solder resist layer 32. The wiring layer 40 includes wiring portions 50, 60, and 70 differing from each other in volume.

The wiring portion 50 includes a via wiring 51, which fills the opening 33, and a columnar connection terminal 52, which is electrically connected to the via wiring 51 and formed on the upper surface 32A of the solder resist layer 32. The wiring portion 60 includes a via wiring 61, which fills the opening 34, and a columnar connection terminal 62, which is electrically connected to the via wiring 61 and formed on the upper surface 32A of the solder resist layer 32. The wiring portion 70 includes a via wiring 71, which fills the opening 35, and a columnar connection terminal 72, which is electrically connected to the via wiring 71 and formed on the upper surface 32A of the solder resist layer 32.

The via wirings 51, 61, and 71 respectively have the same shape as the openings 33, 34, and 35. In the present example, the planar shape of the via wirings 51, 61, and 71 is circular. The via wiring 51 has a larger diameter than each of the via wirings 61 and 71. The via wiring 61 has a larger diameter than the via wiring 71. The via wiring 51 has a greater volume than each of the via wirings 61 and 71. The via wiring 61 has a greater volume than the via wiring 71.

The connection terminals 52, 62, and 72 may have any planar shape and size. The connection terminals 52, 62, and 72 may have, for example, an identical planar shape. In the present example, the planar shape of the connection terminals 52, 62, and 72 is circular in the same manner as the via wirings 51, 61, and 71. In the present example, the connection terminals 52, 62, and 72 are cylindrical. The connection terminals 52, 62, and 72 have the same height (thickness). For example, the height of the connection terminals 52, 62, and 72 may be approximately 5 to 30 μm.

The connection terminals 52, 62, and 72 have, for example, a greater dimension (e.g., diameter) than the respective via wirings 51, 61, and 71. In the present example, the connection terminal 52 has a greater dimension than the connection terminals 62 and 72. The connection terminal 62 has a greater dimension than the connection terminal 72. Additionally, for example, the connection terminal 52 has a larger volume than each of the connection terminals 62 and 72. The connection terminal 62 has a larger volume than the connection terminal 72.

The connection terminals 52, 62, and 72 are used as electronic component mount pads, which are configured to be electrically connected to electronic components such as semiconductor elements. The connection terminals 52, 62, and 72 are, for example, electrically connected to different subjects. The connection terminal 52, which has the largest volume, is, for example, a power supply pad that is connected to ground (GND) or a power supply. The connection terminals 62 and 72, which have relatively small volumes, are, for example, signal pads.

As necessary, a surface-processed layer is formed on surfaces (both upper and side surfaces or only upper surface) of each of the connection terminals 52, 62, and 72. Examples of the surface-processed layer include gold (Au) layer, nickel (Ni) layer/Au layer (metal layer in which Ni layer is used as bottom layer, and Au layer is formed on Ni layer), Ni layer/palladium (Pd) layer/Au layer (metal layer in which Ni layer is used as bottom layer, and Ni layer, Pd layer, and Au layer are sequentially formed). Further examples of the surface-processed layer include Ni layer/Pd layer (metal layer in which Ni layer is used as bottom layer, and Pd layer is formed on Ni layer) and Pd layer/Au layer (metal layer in which Pd layer is used as bottom layer, and Au layer is formed on Pd layer). Au layer is a metal layer formed with Au or Au alloy, Ni layer is a metal layer formed with Ni or Ni alloy, and Pd layer is a metal layer formed with Pd or Pd alloy. Each of Au layer, Ni layer, and Pd layer may be, for example, an electroless metal plated layer formed through an electroless plating process or an electrolytic metal plated layer formed through an electrolytic plating process. An anti-oxidation process such as an organic solderability preservative (OSP) process may be performed to form an OSP film as the surface-processed layer. For example, a coating of an organic compound such as an azole compound or an imidazole compound may be used as the OSP film.

The structure of the wiring portions 50, 60, and 70 will now be described.

The via wirings 51, 61, and 71 of the wiring portions 50, 60, and 70 have an electroless plating structure 41 including N layers, where N represents an integer greater than or equal to zero. The via wiring 51 has a two-layer electroless plating structure 41. The via wiring 61 has a one-layer electroless plating structure 41. The via wiring 71 has a zero-layer electroless plating structure 41. That is, the via wiring 71 does not have the electroless plating structure 41.

The structure of the wiring portion 50 will now be described in detail.

The electroless plating structure 41 of the via wiring 51 includes base plated layers 53 and 54, which are sequentially formed on the upper surface of the wiring layer 31 (wiring portion 31A) exposed in the bottom of the opening 33. The base plated layers 53 and 54 are each an electroless plated layer formed through an electroless plating process. The material of the base plated layers 53 and 54 may be copper (Cu), nickel (Ni), palladium (Pd), gold (Au), silver (Ag), tin (Sn), or an alloy including at least one of these metals. Each of the base plated layers 53 and 54 may have a single-layer structure formed of a single metal layer or a multilayer structure formed by stacking multiple metal layers. The base plated layers 53 and 54 may have the same layer structure or may have different layer structures. In the present example, the base plated layer 53 has a two-layer structure in which a Cu layer 53A and a Ni layer 53B are sequentially formed on the upper surface of the wiring portion 31A exposed in the bottom of the opening 33. In the present example, the base plated layer 54 has a single-layer structure formed of only a single Ni layer 54A.

The Cu layer 53A is an electroless plated layer formed of Cu or a Cu alloy. Each of the Ni layers 53B and 54A is an electroless plated layer formed of Ni or a Ni alloy. Each of the Ni layers 53B and 54A is, for example, an electroless plated layer formed from a metal material harder than the wiring layer 31 (wiring portion 31A). The material of metal layers (here, Ni layers 53B and 54A) located in the outermost layers (here, uppermost layer) of the base plated layers 53 and 54 may be, for example, a metal differing from the wiring layer 31. The material of metal layers (here, Ni layers 53B and 54A) located in the uppermost layers of the base plated layers 53 and 54 may be, for example, a metal material having a superior environmental resistance and a superior processability to the metal material of the wiring layer 31.

The Cu layer 53A and the Ni layer 53B, which configure the base plated layer 53, are successively formed without interruption by another step. In this specification, multiple metal layers, such as the Cu layer 53A and the Ni layer 53B, successively formed without interruption by another step is treated as a one-layer (N=1) electroless plating structure 41.

Further examples of the base plated layers 53 and 54 include Ni layer/Pd layer/Au layer (metal layer in which Ni layer is used as bottom layer, and Ni layer, Pd layer, and Au layer are sequentially formed) and Ni layer/Au layer (metal layer in which Ni layer is used as bottom layer, and Au layer is formed on Ni layer). The Ni layer/Pd layer/Au layer and the Ni layer/Au layer correspond to the multiple metal layers successively formed without interruption by another step. In this specification, the Ni layer/Pd layer/Au layer and the Ni layer/Au layer are each treated as a one-layer (N=1) electroless plating structure 41.

The base plated layer 53 covers the entire upper surface of the wiring layer 31 (wiring portion 31A) exposed in the opening 33. The base plated layer 54 covers the entire upper surface of the base plated layer 53. The base plated layers 53 and 54 have a width (diameter) that is the same as the open width (open diameter) of the bottom of the opening 33. For example, the base plated layers 53 and 54 fill a lower portion of the opening 33. For example, the side surface of the base plated layers 53 and 54 is formed along the wall surface of the lower portion of the opening 33. In the present example, the electroless plating structure 41 (base plated layers 53 and 54) is tapered so that the width (diameter) is decreased from the upper side (upper surface of Ni layer 54A) toward the lower side (lower surface of Cu layer 53A) in FIG. 1. For example, the base plated layers 53 and 54 have the form of an inverted truncated cone so that the upper surface of the Ni layer 54A is greater than the lower surface of the Cu layer 53A. In the present example, each of the base plated layers 53 and 54 is tapered so that the width (diameter) is continuously decreased from the upper side toward the lower side in FIG. 1. Thus, the side surface of the base plated layer 53 and the side surface of the base plated layer 54 continuously and linearly extend.

The wiring portion 50 includes a seed layer 55, which continuously covers the wall surface of the opening 33 and the upper surface 32A of the solder resist layer 32. In the present example, the seed layer 55 continuously covers the entire upper surface of the base plated layer 54 (here, Ni layer 54A), the entire wall surface of the opening 33 exposed above the base plated layers 53 and 54, and the upper surface 32A of the solder resist layer 32. The material of the seed layer 55 may be, for example, Cu or a Cu alloy. The seed layer 55 may be, for example, an electroless metal plated layer (e.g., electroless copper plated layer) formed through an electroless metal plating process (e.g., electroless copper plating process).

The wiring portion 50 includes an electrolytic plated layer 56, which is formed on the seed layer 55 and fills the opening 33. The electrolytic plated layer 56 is a metal layer formed through an electrolytic metal plating process. The material of the electrolytic plated layer 56 may be Cu or a Cu alloy.

As described above, the via wiring 51 of the wiring portion 50 includes the electroless plating structure 41 including two layers (N=2) formed of the base plated layers 53 and 54, and the seed layer 55 and the electrolytic plated layer 56, which are formed in the opening 33. The two-layer electroless plating structure 41 (the base plated layers 53 and 54) is located between the electrolytic plated layer 56 and the upper surface of the wiring portion 31A exposed in the bottom of the opening 33.

The wiring portion 50 includes a metal post 57, which is formed on the via wiring 51 (electrolytic plated layer 56) and the seed layer 55 located on the upper surface 32A of the solder resist layer 32. The metal post 57 is columnar and projects upward from the upper surface 32A of the solder resist layer 32. The metal post 57 is formed integrally with the electrolytic plated layer 56. The metal post 57 is a metal layer formed through an electrolytic metal plating process. The material of the metal post 57 may be Cu or a Cu alloy.

In the present example, the connection terminal 52 of the wiring portion 50 includes the metal post 57 and the seed layer 55 located on the upper surface 32A of the solder resist layer 32.

The structure of the wiring portion 60 will now be described in detail.

The electroless plating structure 41 of the via wiring 61 includes only a base plated layer 64, which is formed on the upper surface of the wiring layer 31 (wiring portion 31B) exposed in the bottom of the opening 34. The base plated layer 64 is an electroless plated layer having the same layer structure as the base plated layer 54 and formed from the same material as the base plated layer 54. Thus, in the present example, the base plated layer 64 has a single-layer structure formed of only the single Ni layer 54A. The base plated layer 64 and the base plated layer 54 have the same thickness. Thus, the electroless plating structure 41 of the via wiring 61 is thinner than the electroless plating structure 41 of the via wiring 51 by an amount corresponding to the base plated layer 53.

The base plated layer 64 covers, for example, the entire upper surface of the wiring layer 31 (wiring portion 31B) exposed in the opening 34. Thus, the base plated layer 64 has a width (diameter) that is the same as the open width (open diameter) of the bottom of the opening 34. For example, the base plated layer 64 fills a lower portion of the opening 34. For example, the side surface of the base plated layer 64 is formed along the wall surface of the lower portion of the opening 34. The base plated layer 64 is tapered so that the width (diameter) is decreased from the upper surface toward the lower surface in FIG. 1. For example, the base plated layer 64 has the form of an inverted truncated cone so that the upper surface is larger than the lower surface.

The wiring portion 60 includes a seed layer 65, which continuously covers the wall surface of the opening 34 and the upper surface 32A of the solder resist layer 32. In the present example, the seed layer 65 continuously covers the entire upper surface of the base plated layer 64, the entire wall surface of the opening 34 exposed above the base plated layer 64, and the upper surface 32A of the solder resist layer 32. The seed layer 65 is a metal layer having the same layer structure as the seed layer 55 and formed from the same material as the seed layer 55.

The wiring portion 60 includes an electrolytic plated layer 66, which is formed on the seed layer 65 and fills the opening 34. The electrolytic plated layer 66 is a metal layer, for example, having the same layer structure as the electrolytic plated layer 56 and formed from the same material as the electrolytic plated layer 56.

As described above, the via wiring 61 of the wiring portion 60 includes the electroless plating structure 41 including one layer (N=1) formed of the base plated layer 64, and the seed layer 65 and the electrolytic plated layer 66, which are formed in the opening 34. The one-layer electroless plating structure 41 (base plated layer 64) is located between the electrolytic plated layer 66 and the upper surface of the wiring portion 31B exposed in the bottom of the opening 34.

The wiring portion 60 includes a metal post 67, which is formed on the via wiring 61 (electrolytic plated layer 66) and the seed layer 65 located on the upper surface 32A of the solder resist layer 32. The metal post 67 is columnar and projects upward from the upper surface 32A of the solder resist layer 32. The metal post 67 is formed, for example, integrally with the electrolytic plated layer 66. The metal post 67 is a metal layer, for example, having the same layer structure as the metal post 57 and formed from the same material as the metal post 57.

In the present example, the connection terminal 62 of the wiring portion 60 includes the metal post 67 and the seed layer 65 located on the upper surface 32A of the solder resist layer 32.

The structure of the wiring portion 70 will now be described in detail.

The wiring portion 70 includes a seed layer 75, which continuously covers the wall surface of the opening 35 and the upper surface 32A of the solder resist layer 32, and an electrolytic plated layer 76, which is formed on the seed layer 75 and fills the opening 35. In the present example, the seed layer 75 continuously covers the entire upper surface of the wiring layer 31 (wiring portion 31C) exposed in the opening 35, the entire wall surface of the opening 35, and the upper surface 32A of the solder resist layer 32. The seed layer 75 is a metal layer having the same layer structure as the seed layers 55 and 65 and formed from the same material as the seed layers 55 and 65. The electrolytic plated layer 76 is a metal layer, for example, having the same layer structure as the electrolytic plated layer 66 and formed from the same material as the electrolytic plated layer 66.

As described above, the via wiring 71 of the wiring portion 70 includes the seed layer 75 formed in the opening 35 and the electrolytic plated layer 76. In other words, the via wiring 71, which fills the opening 35 having the smallest capacity, does not include an electroless plated layer corresponding to the base plated layers 53, 54, and 64.

The wiring portion 70 includes a metal post 77, which is formed on the via wiring 71 (electrolytic plated layer 76) and the seed layer 75 located on the upper surface 32A of the solder resist layer 32. The metal post 77 is columnar and projects upward from the upper surface 32A of the solder resist layer 32. The metal post 77 is formed, for example, integrally with the electrolytic plated layer 76. The metal post 67 is a metal layer, for example, having the same layer structure as the metal posts 57 and 67 and formed from the same material as the metal posts 57 and 67.

In the present example, the connection terminal 72 of the wiring portion 70 includes the metal post 77 and the seed layer 75 located on the upper surface 32A of the solder resist layer 32.

As described above, the wiring substrate 10 is configured so that as the capacity of the openings 33, 34, and 35 filled with the via wirings 51, 61, and 71 (i.e., volume of via wirings 51, 61, and 71) increases, the thickness of the electroless plating structures 41 of the via wirings 51, 61, and 71 is increased. In the present example, the via wiring 51, which fills the opening 33 having the largest capacity, includes the base plated layers 53 and 54 of two layers. The via wiring 61, which fills the opening 34 having the second largest capacity, includes the base plated layer 64 of one layer. The via wiring 71, which fills the opening 35 having the smallest capacity, does not include the base plated layers 53, 54, and 64. With such a configuration, the openings 33, 34, and 35 have substantially the same capacity of space filled with the electrolytic plated layers 56, 66, and 76. As a result, the metal posts 57, 67, and 77, which are formed on the upper surface of the respective electrolytic plated layers 56, 66, and 76, have the same height (thickness).

The wiring layer 21 is formed on the lower surface of the substrate body 11. The wiring layer 21 is the lowermost wiring layer of the wiring substrate 10.

The solder resist layer 22 is formed on the lower surface of the substrate body 11 and partially covers the wiring layer 21. The solder resist layer 22 is the outermost insulation layer (here, lowermost insulation layer) of the wiring substrate 10. The solder resist layer 22 includes through holes 22X, which partially expose the lower surface of the wiring layer 21 as external connection pads P1. The external connection pads P1 are connected to external connection terminals 85 (refer to FIG. 2) used when the wiring substrate 10 is mounted on a mount substrate such as a motherboard.

As necessary, a surface-processed layer is formed on the lower layer of the wiring layer 21 exposed in the bottom of the through holes 22X. Examples of the surface-processed layer include Au layer, Ni layer/Au layer, Ni layer/Pd layer/Au layer, Ni layer/Pd layer, Pd layer/Au layer, or an OSP film. When a surface-processed layer is formed on the lower surface of the wiring layer 21, the surface-processed layer is used as the external connection pads P1. Portions of the wiring layer 21 exposed in the through holes 22X may be used as external connection terminals. Alternatively, a surface-processed layer may be formed on the wiring layer 21 and used as external connection terminals.

Figure 2:
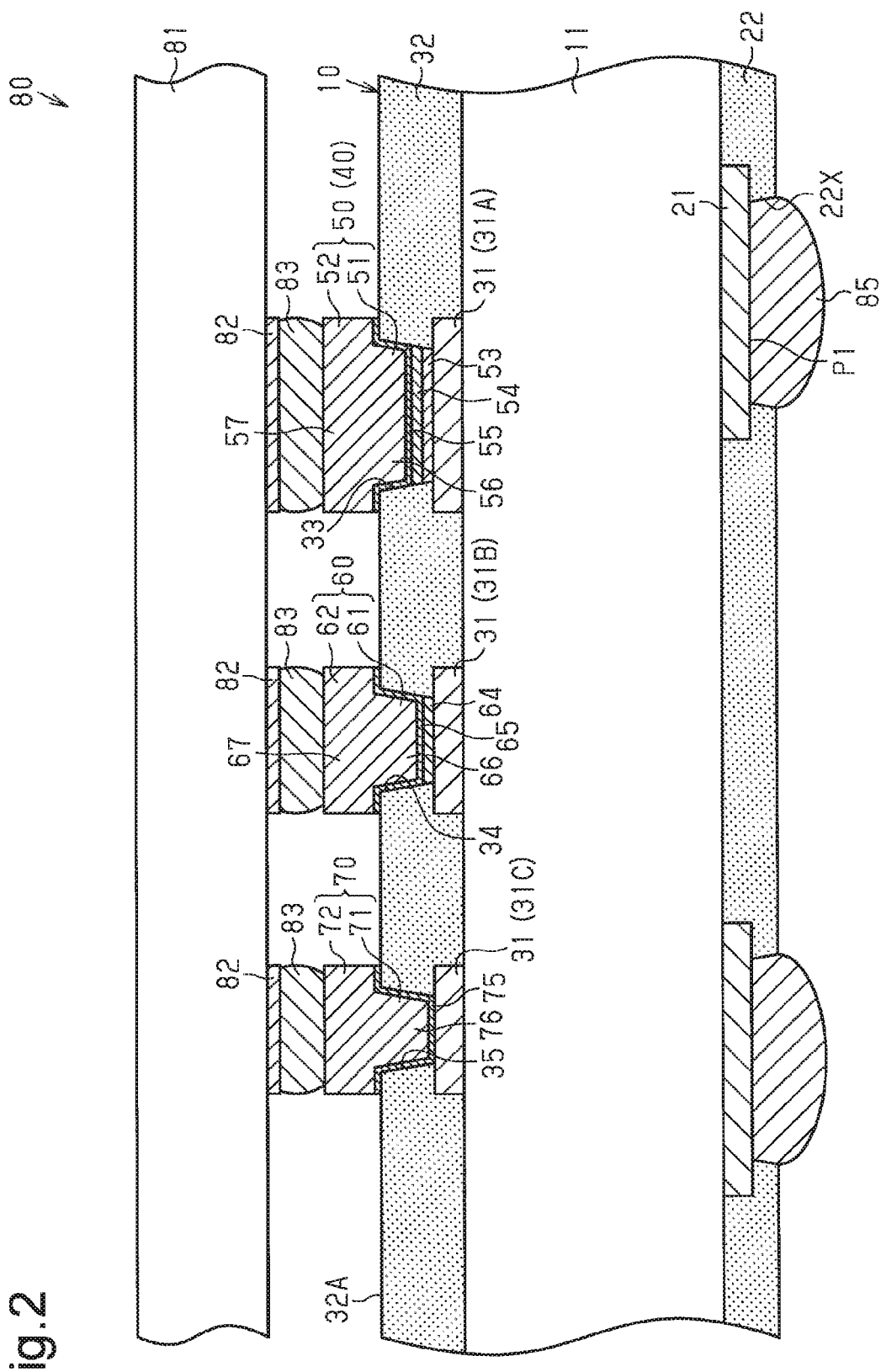
FIG. 2 is a schematic cross-sectional view of a semiconductor device including the wiring substrate illustrated in FIG. 1.

The structure of a semiconductor device 80 will now be described with reference to FIG. 2.

The semiconductor device 80 includes the wiring substrate 10, one or more (one in the example illustrated in FIG. 2) semiconductor elements 81, and the external connection terminals 85.

The semiconductor element 81 is flip-chip mounted on the wiring substrate 10. In the present example, connection terminals 82 are arranged on a circuit formation surface (here, lower surface) of the semiconductor element 81 and joined to the wiring layer 40 (wiring portions 50, 60, and 70) of the wiring substrate 10 by solder portions 83. This electrically connects the semiconductor element 81 to the wiring layer 40 via the connection terminals 82 and the solder portions 83. At this time, the solder portions 83 are joined to the upper surfaces of the connection terminals 52, 62, and 72 and the lower surfaces of the connection terminals 82.

The semiconductor element 81 may be, for example, a logic chip such as a central processing unit (CPU) chip or a graphics processing unit (GPU) chip. The semiconductor element 81 may be, for example, a memory chip such as a dynamic random access memory (DRAM) chip, a static random access memory (SRAM) chip, or a flash memory. Multiple semiconductor elements 81 including a combination of a logic chip and a memory chip may be mounted on the wiring substrate 10.

The connection terminals 82 may be, for example, metal posts. The connection terminals 82 are, for example, columnar connection terminals extending downward from the circuit formation surface of the semiconductor element 81. In the present example, the connection terminals 82 are, for example, cylindrical. The material of the connection terminals 82 may be, for example, Cu or a Cu alloy. The connection terminals 82 may be, for example, metal bumps such as gold bumps instead of metal posts.

The solder portions 83 may be, for example, plating of lead-free solder. The material of the solder plating may be, for example, lead-free solder of Sn—Ag base, Sn—Cu base, Sn—Ag—Cu base, or Sn—Bi base.

The external connection terminals 85 are formed on the external connection pads P1 of the wiring substrate 10. The external connection terminals 85 are, for example, electrically connected to pads that are arranged on a mount substrate such as a motherboard (not illustrated). The external connection terminals 85 may be, for example, solder balls or lead pins. In the present example, solder balls are used as the external connection terminals 85.

A method for manufacturing the wiring substrate 10 will now be described.

In the step illustrated in FIG. 3A, the wiring layer 21 is formed on the lower surface of the substrate body 11, and the wiring layer 31 (wiring portions 31A, 31B, and 31C) is formed on the upper surface of the substrate body 11.

In the step illustrated in FIG. 3B, the solder resist layer 22 is formed on the lower surface of the substrate body 11 to cover the entire surface (lower and side surfaces) of the wiring layer 21. The solder resist layer 32 is formed on the upper surface of the substrate body 11 to cover the entire surface (upper and side surfaces) of the wiring layer 31. The solder resist layers 22 and 32 are formed, for example, by lamination of a photosensitive solder resist film or application of a liquid solder resist.

In the step illustrated in FIG. 4A, the through holes 22X are formed in desired portions of the solder resist layer 22 to partially expose the lower surface of the wiring layer 21 as the external connection pads P1. Also, the opening 33 is formed in a desired portion of the solder resist layer 32 to partially expose the upper surface of the wiring portion 31A of the wiring layer 31. In this step, only the opening 33, which has the largest capacity among the openings 33, 34, and 35 illustrated in FIG. 1, is formed. The through holes 22X and the opening 33 are formed, for example, by photolithography or laser drilling using, for example, a $CO_2$ laser or a YAG laser. In the present example, the opening 33 is formed by photolithography.

When the through holes 22X and the opening 33 are formed by laser drilling, a desmear process is performed to remove resin smears from surfaces of the wiring layers 21 and 31 exposed in the bottoms of the through holes 22X and the opening 33 as necessary.

In the step illustrated in FIG. 4B, an electroless metal plating process is performed to form the base plated layer 53 on the upper surface of the wiring layer 31 (wiring portion 31A) exposed in the opening 33 of the solder resist layer 32 so that the entire upper surface is covered. In the present example, the base plated layer 53 is formed by stacking the Cu layer 53A and the Ni layer 53B on the upper surface of the wiring portion 31A in this order.

The Cu layer 53A may be formed, for example, through an electroless copper plating process using a plating solution including a mixture of copper sulfate, sodium hydroxide, carboxylate, nickel sulfate, and formaldehyde. The Ni layer 53B may be formed, for example, through an electroless metal plating process using a plating solution of a mixture of nickel sulfate, carboxylate, sodium hypophosphite, and a sulfur compound.

In the step illustrated in FIG. 5A, the opening 34 is formed in a desired portion of the solder resist layer 32 to partially expose the upper surface of the wiring portion 31B of the wiring layer 31. In this step, only the opening 34, which has the second largest capacity among the openings 33, 34, and 35 illustrated in FIG. 1, is formed. The opening 34 is formed, for example, by laser drilling using, for example, a $CO_2$ laser or a YAG laser.

In the step illustrated in FIG. 5B, an electroless metal plating process is performed to form the base plated layer 54 covering the entire upper surface of the base plated layer 53 and form the base plated layer 64 covering the entire upper surface of the wiring portion 31B exposed in the opening 34 of the solder resist layer 32. In the present example, the base plated layer 54 is formed by forming the single Ni layer 54A on the upper surface of the base plated layer 53 (Ni layer 53B). In the same manner, the base plated layer 64 is formed by forming the single Ni layer 54A on the upper surface of the wiring portion 31B. The Ni layer 54A may be formed, for example, through an electroless metal plating process using a plating solution of a mixture of nickel sulfate, carboxylate, sodium hypophosphite, and a sulfur compound.

In the step illustrated in FIG. 6A, the opening 35 is formed in a desired portion of the solder resist layer 32 to partially expose the upper surface of the wiring portion 31C of the wiring layer 31. In this step, only the opening 35, which has the smallest capacity among the openings 33, 34, and 35 illustrated in FIG. 1, is formed. The opening 35 is formed, for example, by laser drilling using, for example, a $CO_2$ laser or a YAG laser.

In the step illustrated in FIG. 6B, a seed layer 42 is formed to continuously cover the entire upper surface of the wiring portion 31C exposed in the opening 35, the entire wall surface of the opening 35, the entire upper surface 32A of the solder resist layer 32, the entire wall surface of the opening 34, the entire upper surface of the base plated layer 64, the entire wall surface of the opening 33, and the entire upper surface of the base plated layer 54. The seed layer 42 may be formed, for example, through an electroless copper plating process using a plating solution including a mixture of copper sulfate, sodium hydroxide, carboxylate, nickel sulfate, and formaldehyde.

Figure 7A:
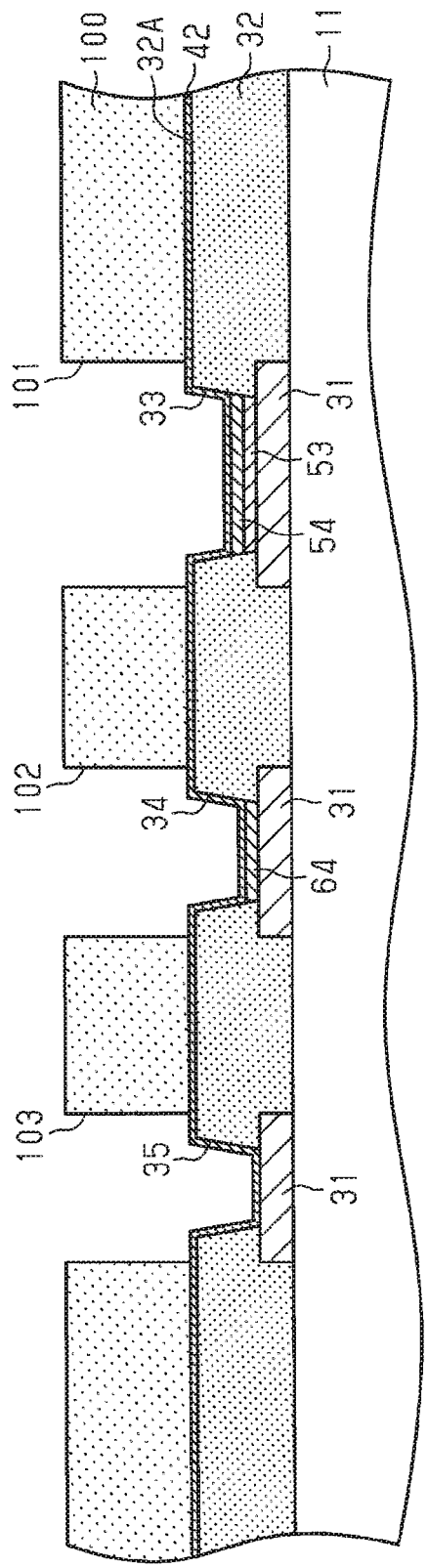

In the step illustrated in FIG. 7A, a resist layer 100 including open patterns 101, 102, and 103 is formed on the seed layer 42 located on the upper surface 32A of the solder resist layer 32. The open pattern 101 exposes a portion of the seed layer 42 corresponding to the region in which the metal post 57 (refer to FIG. 1) is formed. The open pattern 102 exposes a portion of the seed layer 42 corresponding to the region in which the metal post 67 (refer to FIG. 1) is formed. The open pattern 103 exposes a portion of the seed layer 42 corresponding to the region in which the metal post 77 (refer to FIG. 1) is formed. For example, a material having resistance to the electrolytic plating process performed in the next step may be used as the material of the resist layer 100. For example, a photosensitive dry film resist or a liquid photoresist may be used as the resist layer 100. Such a resist material may be a novolac resin or an acrylic resin. For example, when a photosensitive dry film resist is used, the upper surface of the seed layer 42 is laminated with a dry film through thermocompression bonding, and the dry film is patterned through photolithography to form the resist layer 100 including the open patterns 101, 102, and 103. When a liquid photoresist is used, the resist layer 100 may also be formed by the same steps.

Figure 7B:
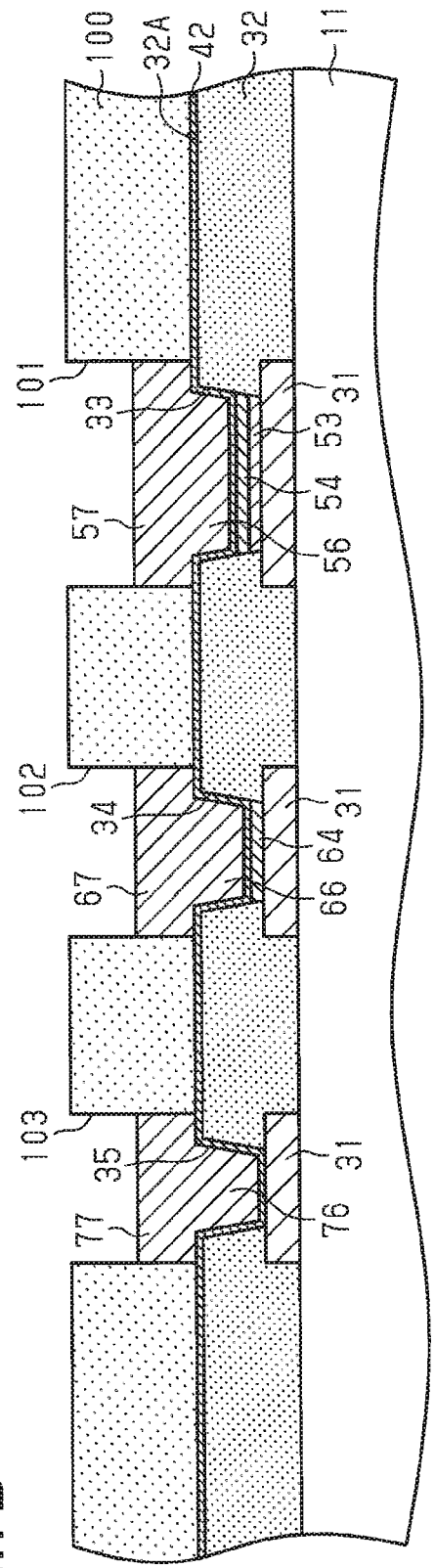

In the step illustrated in FIG. 7B, the resist layer 100 is used as a plating mask and the seed layer 42 is used as a plating power feeding layer, electrolytic plating (e.g., electrolytic copper plating) is performed on the upper surface of the seed layer 42 exposed in the open patterns 101, 102, and 103. As a result, the opening 33 is filled with the electrolytic plated layer 56, and the metal post 57 is formed in the open pattern 101. At the same time, the opening 34 is filled with the electrolytic plated layer 66, and the metal post 67 is formed in the open pattern 102. The opening 35 is filled with the electrolytic plated layer 76, and the metal post 77 is formed in the open pattern 103. Thus, the electrolytic plated layers 56, 66, and 76 and the metal posts 57, 67, and 77 are formed in the same step. At this time, the thicknesses of the electroless plating structures 41 formed in the openings 33 and 34 are adjusted so that the volumes of the electrolytic plated layers 56, 66, and 76 are substantially equal to each other. Thus, the metal posts 57, 67, and 77 formed on the upper surfaces of the electrolytic plated layers 56, 66, and 76 have substantially the same height. The plating solution used in an electrolytic metal plating process performed in this step may be, for example, a solution obtained by dissolving copper sulfate in sulfuric acid.

In the step illustrated in FIG. 8A, the resist layer 100 illustrated in FIG. 7 is removed by an alkaline stripping solution (e.g., organic amine stripping solution, caustic soda, acetone, or ethanol).

In the step illustrated in FIG. 8B, as the metal posts 57, 67, and 77 are used as an etching mask, an unwanted portion of the seed layer 42 is etched and removed. When the seed layer 42 is an electroless copper plated layer, for example, an unwanted portion of the seed layer 42 is removed by wet etching using a sulfuric acid hydrogen peroxide etchant. As a result, portions of the seed layer 42 located under the metal posts 57, 67, and 77 remain as the seed layers 55, 65, and 75, respectively. In this step, the via wiring 51 is formed in the opening 33 of the solder resist layer 32 by the base plated layers 53 and 54 of two layers, the seed layer 55, and the electrolytic plated layer 56. Also, the connection terminal 52 is formed by the seed layer 55 located on the upper surface 32A of the solder resist layer 32 and the metal post 57. As a result, the wiring portion 50 including the via wiring 51 and the connection terminal 52 is formed. In the same manner, the wiring portion 60 including the via wiring 61, which is formed in the opening 34 by the one-layer base plated layer 64, the seed layer 65, and the electrolytic plated layer 66, is formed. The wiring portion 70 including the via wiring 71, which is formed in the opening 35 by the seed layer 75 and the electrolytic plated layer 76, is also formed in the same manner.

The manufacturing steps described above manufacture the wiring substrate 10 illustrated in FIG. 1.

The present embodiment has the advantages described below.

(1) As the capacity of the openings 33, 34, and 35, which are filled with the via wirings 51, 61, and 71, (i.e., volume of via wirings 51, 61, and 71) increases, the thickness of the electroless plating structures 41 (in the present example, the base plated layers 53, 54, and 64) of the via wirings 51, 61, and 71 increases. The adjustment of the thickness of the electroless plating structures 41 adjusts the capacity of the space of the openings 33, 34, and 35 filled with the electrolytic plated layers 56, 66, and 76 to be substantially the same. This limits differences in the height (thickness) between the metal posts 57, 67, and 77, which are formed on the upper surfaces of the electrolytic plated layers 56, 66, and 76, respectively. Thus, the upper surfaces of the connection terminals 52, 62, and 72 (i.e., tops of the wiring portions 50, 60, and 70) are substantially aligned with the same plane. This increases the reliability of connection between the connection terminals 52, 62, and 72 and the semiconductor element 81.

(2) For example, if a base plated layer is formed to cover only a portion of the upper surfaces of the wiring portions 31A and 31B exposed in the bottoms of the openings 33 and 34, the bottoms of the openings 33 and 34 may not be flat. Accordingly, electrolytic plated layers filled in the openings 33 and 34 may not have flat upper surfaces, and metal posts formed on the electrolytic plated layers may not have flat upper surfaces.

In this regard, in the present embodiment, the base plated layers 53 and 54 cover the entire upper surface of the wiring portion 31A exposed in the bottom of the opening 33, and the base plated layer 64 covers the entire upper surface of the wiring portion 31B exposed in the bottom of the opening 34. Thus, even when the base plated layers 53, 54, and 64 are formed, the flatness of the bottoms of the openings 33 and 34 is maintained. Accordingly, the electrolytic plated layers 56 and 66, which are formed on the base plated layers 54 and 64, have flat upper surfaces, and the metal posts 57 and 67, which are formed on the electrolytic plated layers 56 and 66, have flat upper surfaces. This limits differences in height between the metal posts 57, 67, and 77, thereby increasing the reliability of connection between the connection terminals 52, 62, and 72 and the semiconductor element 81.

(3) The thickness of the electroless plating structure 41 in each of the via wirings 51, 61, and 71 is changed by increasing and decreasing the number of layers in the base plated layers 53, 54, and 64. In this case, the number of layers in the base plated layers 53, 54, and 64 is set to be increased as the capacity of the respective openings 33, 34, and 35, which are filled with the via wirings 51, 61, and 71, increases. In the present example, the via wiring 51 formed in the opening 33 includes the base plated layers 53 and 54 of two layers, the via wiring 61 formed in the opening 34 includes the base plated layer 64 of one layer, and the via wiring 71 formed in the opening 35 does not include a base plated layer. Additionally, the base plated layers 54 and 64 are electroless plated layers having the same layer structure and formed from the same material. In this case, the base plated layers 54 and 64 may be formed in a step different from the step of forming the base plated layer 53, and the base plated layers 54 and 64 may be formed in the same step. Thus, when the number of layers in the base plated layer 53 and the number of layers in the base plated layers 54 and 64 may be changed in separate steps, the thickness of each electroless plating structure 41 is changed in any manner. This allows the thickness of the electroless plating structures 41 to be readily changed as compared to a case in which the thickness of each electroless plating structure 41 is changed by changing the thickness of each base plated layer in the same step. Additionally, the second layer (base plated layer 54) formed in the opening 33 and the first layer (base plated layer 64) formed in the opening 34 are formed in the same step. This limits increases in the number of manufacturing steps for forming the base plated layers 53, 54, and 64.

(4) In the present embodiment of the manufacturing method, the openings 33, 34, and 35 having different capacities are formed in separate steps. Thus, the opening 33, which is formed first, is affected by all the processes performed on the openings 34 and 35, which are subsequently formed. The opening 34, which is formed second, is affected by all the processes performed on the opening 35, which is subsequently formed. For example, when the opening 34 is formed and the wiring portion 31B exposed in the opening 34 undergoes flash etching, the flash etching affects the base plated layer 53 formed in the opening 33. Also, when the opening 35 is formed and the wiring portion 31C formed in the opening 35 undergoes flash etching, the flash etching affects the base plated layers 54 and 64 formed in the openings 33 and 34.

In this regard, in the present embodiment, metal layers (in the present embodiment, Ni layers 53B and 54A) formed from a metal material differing from the wiring layer 31 are formed in the outermost layers of the base plated layers 53, 54, and 64. In this structure, because the metal of the outermost layers of the base plated layers 53, 54, and 64 differs from the metal (e.g., Cu) of the wiring layer 31, the effect of flash etching of the wiring layer 31 on the base plated layers 53, 54, and 64 is limited.

(5) A metal material having a superior environmental resistance and a superior processability to the metal material of the wiring layer 31 is used as the metal material of the outermost layers of the base plated layers 53, 54, and 64. In the present example, the Ni layers 53B and 54A are used as the outermost layers of the base plated layers 53, 54, and 64. Thus, even when the base plated layers 53, 54, and 64 are subject to a process performed on other openings (e.g., openings 34 and 35), the quality of the base plated layers 53, 54, and 64 will not deteriorate.

(6) A metal material harder than the wiring layer 31 is used as the metal material of the outermost layers of the base plated layers 53, 54, and 64. In the present example, the Ni layers 53B and 54A are used as the outermost layers of the base plated layers 53, 54, and 64. Thus, the hard Ni layers 53B and 54A are located in the via wirings 51 and 61, which have large volumes and receive great stress. The Ni layers 53B and 54A increase the mechanical strength of the via wirings 51 and 61 and reduce stress applied to the via wirings 51 and 61.

(7) The wall surfaces of the openings 33, 34, and 35 linearly extend without steps. Namely, each of the openings 33, 34, and 35 is formed in a single step. This limits increases in the size of the open diameter of the bottom of the openings 33, 34, and 35 as compared to a case in which each of the openings 33, 34, and 35 is formed by multiple openings that are in communication with each other. For example, in a case in which the openings 33, 34, and 35 are each configured by multiple openings having open diameters that decrease from the lower side (upper surface of wiring layer 31) toward the upper side in a stepped manner, the open diameter of each opening is larger at the bottom. Thus, the wiring layer 31 needs to be designed to have a large planar shape. Thus, miniaturization of the wiring layer 31 may not be achieved. In this regard, in the present embodiment, each of the openings 33, 34, and 35 is formed by a single opening. This limits increases in the open diameter of the bottom of each opening, thereby limiting increases in the planar shape of the wiring layer 31. As a result, miniaturization of the wiring layer 31 is readily achieved.

(8) The side surface of the base plated layer 53 and the side surface of the base plated layer 54 continuously and linearly extend along the wall surface of the opening 33. As compared to a case in which the side surface of the base plated layer 53 and the side surface of the base plated layer 54 are formed in a stepped manner, increases in the planar shape of the base plated layer 53 are limited. Accordingly, increases in the planar shape of the wiring layer 31 are limited.

It should be apparent to those skilled in the art that the foregoing embodiments may be implemented in many other specific forms without departing from the scope of this disclosure. Particularly, it should be understood that the foregoing embodiments may be implemented in the following forms.

The embodiments and the following modified examples may be combined as long as the combined modifications remain technically consistent with one another.

In the embodiment, the solder resist layer 32 may include a number of openings including the openings 33, 34, and 35. In this case, the corresponding one of the openings 33, 34, and 35 for each of the number of openings may be determined based on first to third capacity ranges that are respectively set for the openings 33, 34, and 35. In this case, the first to third capacity ranges are set not to overlap with each other. For example, when the capacity of an opening is included in the first capacity range associated with the opening 33, the via wiring 51 having the base plated layers 53 and 54 of two layers is formed in the opening. When the capacity of an opening is included in the second capacity range associated with the opening 34, the via wiring 61 having the one-layer base plated layer 64 is formed in the opening. When the capacity of an opening is included in the third capacity range associated with the opening 35, the via wiring 71 having no electroless plating structure 41 is formed in the opening. The capacity ranges are set to ranges that allow all of the metal posts to have a substantially fixed height based on, for example, test results or simulation results.

In the embodiment, the solder resist layer 32 includes the three openings 33, 34, and 35 having different capacities. However, there is no limitation to such a configuration. For example, the solder resist layer 32 may include two openings having different capacities. For example, the solder resist layer 32 may include only the openings 34 and 35. In this case, the opening 34 having the largest capacity may be formed through photolithography. Alternatively, the solder resist layer 32 may include only the openings 33 and 34.

Alternatively, the solder resist layer 32 may include four openings having different capacities. For example, when an opening having a larger capacity than the opening 33 is formed, a via wiring formed in the opening may have an electroless plating structure 41 formed by three base plated layers. The solder resist layer 32 may include five or more openings having different capacities.

Figure 9:
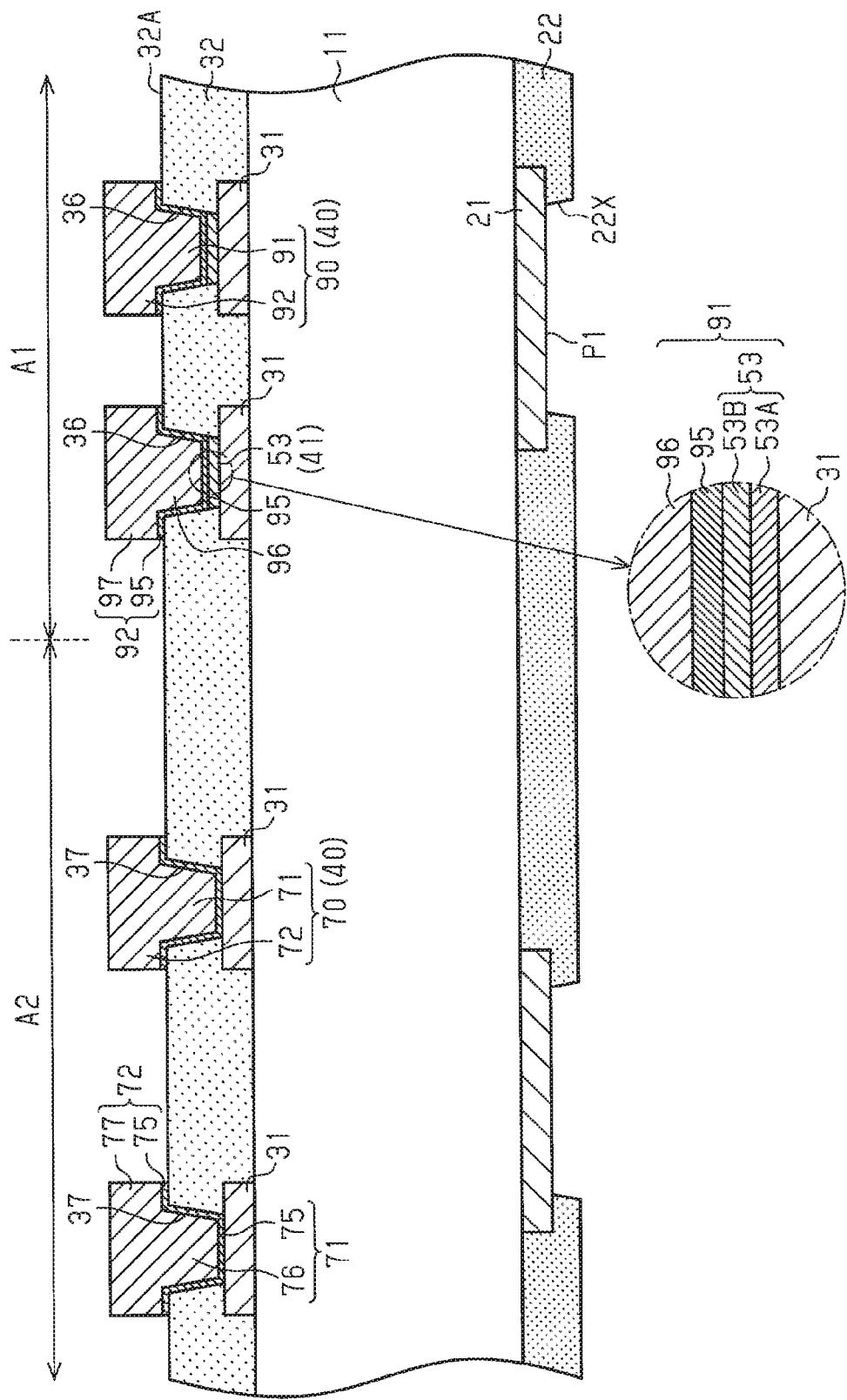
FIG. 9 is a schematic cross-sectional view illustrating a method for manufacturing a wiring substrate of a modified example.

As illustrated in FIG. 9, the thickness of the electroless plating structure 41 of the via wiring may be changed in accordance with the density (congestion state) of openings formed in the solder resist layer 32. For example, the wiring layer 40 includes multiple wiring portions 90 located in a high density region A1 and multiple wiring portions 70 located in a low density region A2, which has a lower density than the high density region A1. In this case, openings 36 are arranged in the high density region A1, and a via wiring 91 having, for example, a one-layer electroless plating structure 41 is formed in each opening 36. The electroless plating structure 41 of the via wiring 91 is formed of, for example, the base plated layer 53. Also, openings 37 are arranged in the low density region A2, and the via wiring 71 having no electroless plating structure 41 is formed in each opening 37.

Each wiring portion 70 is formed in the same manner as in the embodiment (for example, refer to FIG. 1) and includes the via wiring 71 filled in the opening 37 and the columnar connection terminal 72, which is electrically connected to the via wiring 71 and formed on the upper surface 32A of the solder resist layer 32. Each wiring portion 90 includes the via wiring 91 filled in the opening 36 and a columnar connection terminal 92, which is electrically connected to the via wiring 91 and formed on the upper surface 32A of the solder resist layer 32.

The pitch between the wiring portions 90 arranged in the high density region A1 is less than the pitch between the wiring portions 70 arranged in the low density region A2. In this modified example, the open width of each opening 36 is set to be the same as the open width of each opening 37.

The structure of the wiring portion 90 will now be described.

The wiring portion 90 includes a seed layer 95, which continuously covers the entire upper surface of the base plated layer 53, the entire wall surface of the opening 36, and the upper surface 32A of the solder resist layer 32. The seed layer 95 is a metal layer having the same layer structure as the seed layer 75 and formed from the same material as the seed layer 75.

The wiring portion 90 includes an electrolytic plated layer 96, which is formed on the seed layer 95 and fills the opening 36. The electrolytic plated layer 96 is a metal layer, for example, having the same layer structure as the electrolytic plated layer 76 and formed from the same material as the electrolytic plated layer 76.

As described above, the via wiring 91 of the wiring portion 90 includes the electroless plating structure 41 including one layer formed of the base plated layer 53, and the seed layer 95 and the electrolytic plated layer 96, which are formed in the opening 36.

The wiring portion 90 includes a metal post 97, which is formed on the via wiring 91 (electrolytic plated layer 96) and the seed layer 95 located on the upper surface 32A of the solder resist layer 32. The metal post 97 is columnar and projects upward from the upper surface 32A of the solder resist layer 32. The metal post 97 is formed, for example, integrally with the electrolytic plated layer 96. The metal post 97 is a metal layer, for example, having the same layer structure as the metal post 77 and formed from the same material as the metal post 77.

As described above, the connection terminal 92 of the wiring portion 90 includes the metal post 97 and the seed layer 95 located on the upper surface 32A of the solder resist layer 32.

If the wiring layers 40 have the same structure in the high density region A1 and the low density region A2, the metal post 97 formed in the high density region A1 may be lower (thinner) than the metal post 77 formed in the low density region A2. In this regard, in FIG. 9, the wiring portions 90 located in the high density region A1 and the wiring portions 70 located in the low density region A2 have different structures. In this example, only the wiring portions 90 have the electroless plating structure 41. This limits differences in height between the metal post 77 and the metal post 97. Thus, the reliability of connection between the connection terminals 72 and 92 and a semiconductor element is increased.

In the embodiment, the openings 33, 34, and 35 and the via wirings 51, 61, and 71 each have a width (diameter) that increases from the lower side (upper surface of wiring layer 31) toward the upper side. In other words, the wall surfaces of the openings 33, 34, and 35 and the circumferential surfaces of the via wirings 51, 61, and 71 are inclined. Instead, for example, the wall surfaces of the openings 33, 34, and 35 and the circumferential surfaces of the via wirings 51, 61, and 71 extend substantially orthogonal to the upper surface of the wiring layer 31 in a cross-sectional view. In other words, the openings 33, 34, and 35 and the via wirings 51, 61, and 71 may have the same width (diameter) from the lower side (upper surface of wiring layer 31) to the upper side.

In the embodiment, the wall surfaces of the openings 33, 34, and 35 linearly extend in a cross-sectional view. However, there is no limitation to such a configuration. For example, the wall surfaces of the openings 33, 34, and 35 may be curved like a circular arc, an elliptical arc, or a parabola.

In the embodiment, the base plated layer 53 has a multilayer structure in which the Cu layer 53A and the Ni layer 53B are sequentially and consecutively formed without interruption by another step. Instead, the base plated layer 53 may have a single-layer structure formed of a single metal layer.

In the embodiment, the base plated layers 54 and 64 have a single-layer structure formed of the single Ni layer 54A. Instead, each of the base plated layers 54 and 64 may have a multilayer structure including multiple metal layers that are continuously formed without interruption by another step.

In the embodiment, the thickness of the electroless plating structure 41 in each of the via wirings 51, 61, and 71 is changed by changing the number of layers in the respective base plated layers 53, 54, and 64. However, there is no limitation to such a configuration. For example, instead of changing the number of layers of the electroless plating structure 41, the thickness of the electroless plating structure 41 in the via wirings 51, 61, and 71 may be increased as the capacity of the respective openings 33, 34, and 35 is increased.

In the embodiment, the seed layer 42 (seed layers 55, 65, and 75) is formed through an electroless metal plating process (e.g., electroless copper plating process). However, there is no limitation to such a configuration. For example, the seed layer 42 (seed layers 55, 65, and 75) may be formed through sputtering or vapor deposition.

In the embodiment, each of the seed layers 55, 65, and 75 has a single-layer structure. However, each of the seed layers 55, 65, and 75 may have a multilayer structure (e.g., two-layer structure). A seed layer having a two-layer structure may have a structure in which, for example, titanium (Ti) layer and Cu layer are sequentially formed.

In the embodiment, the solder resist layers 22 and 32 are used as the outermost insulation layer. However, there is no limitation to such a configuration. The material of the outermost insulation layer is not limited to an insulative resin including a photosensitive insulative resin as a main component and may be, for example, an insulative resin that is non-photosensitive and including a thermosetting resin as a main component. Such a material for the outermost insulation layer may be, for example, a thermosetting resin such as epoxy resin or polyimide resin or a synthetic resin obtained by mixing the thermosetting resin with a filler such as silica and alumina.

In the semiconductor device 80 of the embodiment, an underfill resin may fill a gap between the semiconductor element 81 and the wiring substrate 10.

Instead of the semiconductor element 81, an electric component other than the semiconductor element 81, which is, for example, a chip component such as a chip capacitor, a chip resistor, or a chip inductor or a quartz oscillator may be mounted on the wiring substrate 10 of the embodiment.

CLAUSES

This disclosure further encompasses the following embodiments.

1. A method for manufacturing a wiring substrate, the method including:

forming an insulation layer that covers a plurality of first wiring portions;

forming a first opening that extends through the insulation layer in a thickness-wise direction and exposes an upper surface of one of the first wiring portions;

forming a first base plated layer through an electroless plating process, wherein the first base plated layer covers an entire upper surface of the first wiring portion exposed in a bottom of the first opening;

after forming the first base plated layer, forming a second opening that extends through the insulation layer in the thickness-wise direction and exposes an upper surface of a further one of the first wiring portions that differs from the first wiring portion exposed by the first opening, wherein the second opening has a smaller capacity than the first opening;

forming a seed layer that continuously covers an entire upper surface of the first wiring portion exposed in a bottom of the second opening, an entire wall surface of the second opening, an entire upper surface of the insulation layer, an entire wall surface of the first opening, and an entire upper surface of the first base plated layer;

forming a resist layer on the seed layer, wherein the resist layer includes a first open pattern in a position corresponding to the first opening and a second open pattern in a position corresponding to the second opening;

performing an electrolytic plating process using the seed layer as a power feeding layer to form a first electrolytic plated layer and a first metal post in the first open pattern and form a second electrolytic plated layer and a second metal post in the second open pattern, wherein the first opening is filled with the first electrolytic plated layer, the first metal post is formed on the first electrolytic plated layer, the second opening is filled with the second electrolytic plated layer, and the second metal post is formed on the second electrolytic plated layer;

removing the resist layer; and removing an unwanted portion of the seed layer by using each of the first metal post and the second metal post as a mask.

2. The method according to clause 1, further including, before forming the first opening:

forming a third opening that extends through the insulation layer in the thickness-wise direction and exposes an upper surface of a further one of the first wiring portions that differs from the first wiring portions exposed by the first opening and the second opening, wherein the third opening has a larger capacity than the first opening; and forming a second base plated layer that covers an entire upper surface of the first wiring portion exposed in a bottom of the third opening through an electroless plating process, wherein the forming a first base plated layer includes forming a third base plated layer on an upper surface of the second base plated layer, wherein the third base plated layer has the same layer structure as the first base plated layer and is formed from the same material as the first base plated layer.

All examples and conditional language recited herein are intended for pedagogical purposes to aid the reader in understanding the principles of the invention and the concepts contributed by the inventors to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate, comprising:
a plurality of first wiring portions;
an insulation layer covering the first wiring portions;
a plurality of openings, each of the openings extending through the insulation layer in a thickness-wise direction to partially expose an upper surface of one of the first wiring portions, wherein the openings differ from each other in capacity; and
a plurality of second wiring portions, each of the second wiring portions including a via wiring and a columnar connection terminal, wherein each of the openings is filled with the via wiring of one of the second wiring portions, and the columnar connection terminal is arranged on an upper surface of the insulation layer and electrically connected to the via wiring of a corresponding one of the second wiring portions, wherein the via wiring includes an electrolytic plated layer and an electroless plating structure including N layers where N represents an integer greater than or equal to zero, the electroless plating structure being arranged between the electrolytic plated layer and the upper surface of a corresponding one of the first wiring portions exposed in a bottom of a corresponding one of the openings, the via wiring is formed so that the electroless plating structure has a thickness that increases as a capacity of the corresponding opening filled with the via wiring is increased, the plurality of openings include a first opening and a second opening having a smaller capacity than the first opening, the via wiring with which the first opening is filled is a first via wiring, the first via wiring including:
  a first base plated layer provided as the electroless plating structure including N layers (N=1), wherein the first base plated layer covers an entire upper surface of the corresponding first wiring portion exposed in the bottom of the first opening;
  a first seed layer that continuously covers an entire upper surface of the first base plated layer and an entire wall surface of the first opening; and
  a first electrolytic plated layer arranged on the first seed layer to fill the first opening, and the via wiring with which the second opening is filled is a second via wiring not including the electroless plating structure, the second via wiring including:
  a second seed layer that continuously covers an entire upper surface of the corresponding first wiring portion exposed in the bottom of the second opening and an entire wall surface of the second opening; and
  a second electrolytic plated layer arranged on the second seed layer to fill the second opening.

2. The wiring substrate according to claim 1, wherein the first base plated layer has a single-layer structure or a multilayer structure and includes an electroless plated layer formed from a metal material that differs from the first wiring portions.

3. The wiring substrate according to claim 2, wherein the first base plated layer has a multilayer structure and includes an electroless plated layer formed from a metal material that differs from the first wiring portions as an outermost layer of the multilayer structure.

4. The wiring substrate according to claim 1, wherein
the plurality of openings include a third opening having a larger capacity than the first opening,
the via wiring that fills the third opening includes:
  a second base plated layer and a third base plated layer that are provided as the electroless plating structure including N layers (N=2), wherein the second base plated layer covers an entire upper surface of the corresponding first wiring portion exposed in the bottom of the third opening and the third base plated layer covers an entire upper surface of the second base plated layer;
  a third seed layer that continuously covers an entire upper surface of the third base plated layer and an entire wall surface of the third opening; and
  a third electrolytic plated layer arranged on the third seed layer to fill the third opening, and
the third base plated layer has the same layer structure as the first base plated layer, is formed from the same material as the first base plated layer, and is set to have the same thickness as the first base plated layer.

5. The wiring substrate according to claim 4, wherein the second base plated layer has a single-layer structure or a multilayer structure and includes an electroless plated layer formed from a metal material that differs from the first wiring portions.

6. The wiring substrate according to claim 5, wherein the second base plated layer has a multilayer structure and includes an electroless plated layer formed from a metal material that differs from the first wiring portions as an outermost layer of the multilayer structure.

7. A semiconductor device, comprising:
the wiring substrate according to claim 1; and
a semiconductor element connected to the connection terminal.

* * * * *